United States Patent [19]

Kobiki et al.

[11] Patent Number: 4,956,697
[45] Date of Patent: Sep. 11, 1990

[54] MICROWAVE MONOLITHIC INTEGRATED CIRCUIT WITH HEAT RADIATING ELECTRODE

[75] Inventors: Michihiro Kobiki; Masahiro Yoshida; Takahide Ishikawa, all of Itami, Japan

[73] Assignee: Mitsubishi Denki Kabushiki Kaisha, Tokyo, Japan

[21] Appl. No.: 251,677

[22] Filed: Sep. 30, 1988

[30] Foreign Application Priority Data

Dec. 14, 1987 [JP] Japan .............................. 62-315595

[51] Int. Cl.$^5$ .......................................... H01L 23/02
[52] U.S. Cl. .................................. 357/81; 357/55; 357/65; 357/71; 357/68; 361/386; 165/80.2; 165/80.3
[58] Field of Search .................. 357/81, 55, 65, 71, 357/68, 82; 165/80.2, 80.3; 361/386

[56] References Cited

U.S. PATENT DOCUMENTS 3,986,196  10/1976  Decker et al. ..................... 357/81

FOREIGN PATENT DOCUMENTS 0090651   10/1983  European Pat. Off. ............. 357/81
0123887    9/1979  Japan .............................. 357/81 C
62-298142 12/1987  Japan .............................. 357/74
2100925    1/1983  United Kingdom ............... 357/81

OTHER PUBLICATIONS

"A Packaged 20-GHz 1-W GaAs MESFET with a Novel Via-Hole Plated Heat Sink Structure" *IEE Transactions on Microwave Theory and Techniques,* vol. MTT-32, No. 3, Mar. 1984, at pp. 309-316.
"A K-Band GaAs FET Amplifier with 8.2-W Output Power", *IEE Transactions on Microwave Theory and Techniques,* vol. MTT-32, No. 3, Mar. 1984 at pp. 317-324.

*Primary Examiner*—Rolf Hille
*Assistant Examiner*—Minh Loan Tran
*Attorney, Agent, or Firm*—Leydig, Voit & Mayer

[57] ABSTRACT

A microwave monolithic integrated circuit comprising a GaAs substrate having upper and lower opposed surfaces, an active region and at least one passive region produced on the upper surface of the substrate, and a heat sink produced on the lower surface of the substrate, wherein the substrate thickness beneath the active region is smaller than the substrate thickness beneath at least one passive region, thereby disposing the heat sink near the active region to improve heat dissipation therefrom. The active region and the passive regions are separated by intermediate areas and the substrate thickness beneath the intermediate areas is smaller than the substrate thickness beneath the active region such that the heat sink at least partially surrounds the substrate beneath the active region. Each passive region is associated with a respective microwave transmission line having a predetermined width and a desired characteristic impedance and the thickness of the substrate beneath each of the passive regions is established individually based on the width and the desired characteristic impedance of each respective microwave transmission line.

10 Claims, 6 Drawing Sheets

MICROWAVE MONOLITHIC INTEGRATED CIRCUIT WITH HEAT RADIATING ELECTRODE

TECHNICAL FIELD

This invention relates generally to improved microwave monolithic integrated circuits, and more specifically to heat radiating electrodes for such circuits.

BACKGROUND ART

Figure 1:
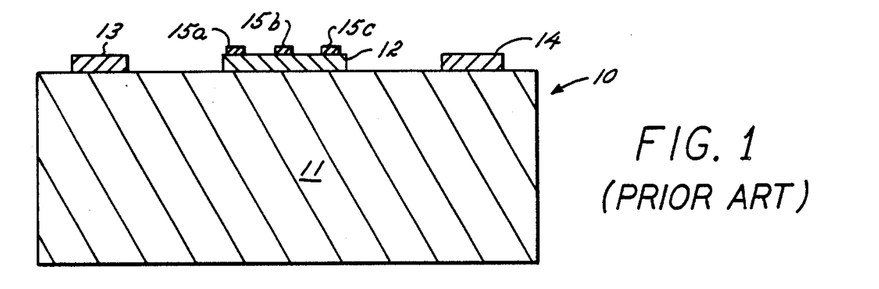
FIG. 1 is a cross-sectional view of a prior art MMIC.

Microwave monolithic integrated circuits (MMIC) made of gallium arsenide (GaAs) are well known in the art and typically have a configuration similar to that which is shown in FIG. 1. More specifically, a GaAs MMIC 10 generally comprises a GaAs substrate 11 having an active region 12 and first and second passive regions 13, 14. The active region 12 may, for example, comprise at least one MESFET having three electrodes: a drain 15a, a gate 15b and a source 15c. The drain 15a and the source 15c may be respectively connected to the microwave band matching circuits comprising the passive regions 13, 14 by means of metallized bridges (not shown in FIG. 1). Constituted as such, the GaAs MMIC 10 may be used as a high frequency amplifier.

In a GaAs MMIC used as a high output amplifier, the operational temperature of the active region 12 may exceed 100° C. Therefore, it is important that the MMIC be provided with means for radiating the heat, thereby enhancing its operational characteristics and reliability. In the prior art GaAs MMIC shown in FIG. 1, heat generated in the active region 12 radiates downwardly through the GaAs substrate 11. Since GaAs has a low thermal conductivity, however, the heat radiation characteristics of this prior art GaAs MMIC are inadequate.

Figure 2A:
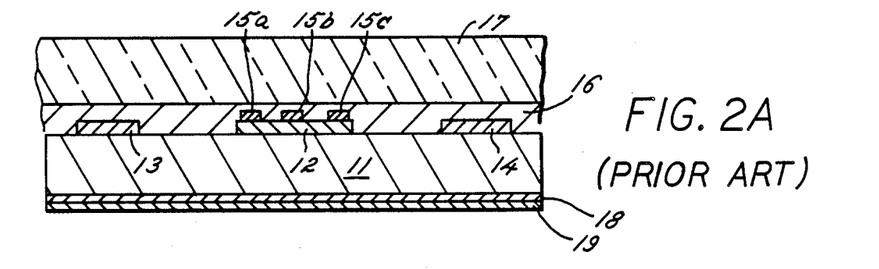
FIGS. 2A to 2C illustrate in cross section a prior art process for producing an MMIC having a heat sink plated thereon.
Figure 2B:
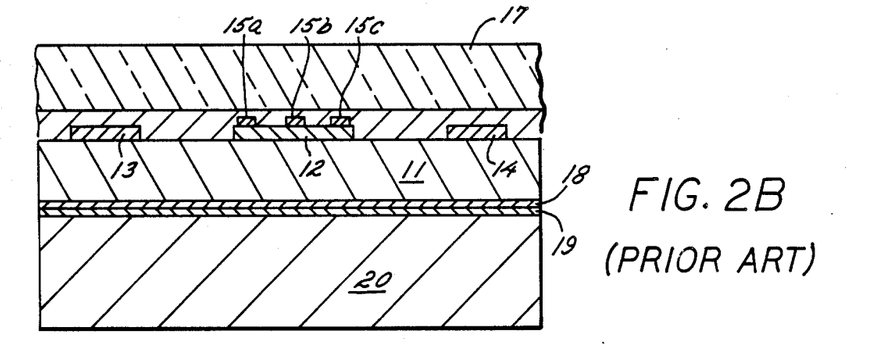
Figure 2C:
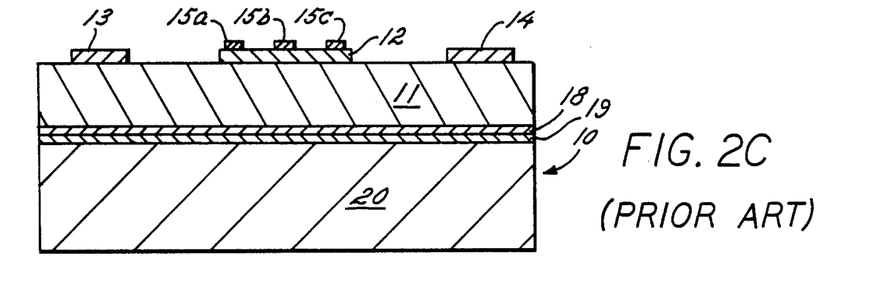

Another prior art GaAs MMIC, in which a relatively good heat radiation effect is obtained, is shown in FIG. 2C. GaAs MMICs of such construction are disclosed in "A Packaged 20-GHz 1-W GaAs MESFET with a Novel Via-Hole Plated Heat Sink Structure" and "A K-Band GaAs FET Amplifier with 8.2-W Output Power", which appeared in *IEEE Transactions on Microwave Theory and Techniques*, Vol. MTT-32, No. 3, March 1984 at pages 309-316 and 317-324, respectively.

A method of producing this type of GaAs MMIC is illustrated in FIG. 2. First, as shown in FIG. 2A, a coating of wax 16 is provided over the entire surface of the MMIC to protect the active region 12 and the passive regions 13, 14, and a glass plate 17 is provided thereon. The GaAs substrate 11 is then reduced to a thickness of approximately 50 microns by grinding, for example. Thereafter, titanium and gold are successively plated on the GaAs substrate 11, thereby producing a titanium cladding layer 18 and a gold cladding layer 19. Next, as shown in FIG. 2B, a plated heat sink (PHS) 20 having a thickness of approximately 50 microns is electrolytically plated on the gold cladding layer 19. Preferably, the plated heat sink should be comprised of a material having high thermal conductivity, such as gold. To complete the production of the GaAs MMIC, the glass plate 17 and the wax 16 are removed (see FIG. 2C).

In a GaAs MMIC having a structure such as described above and shown in FIG. 2C, heat generated in the active region 12 is more efficiently radiated through the PHS 20. However, due to the substantially decreased thickness of the GaAs substrate underlying the passive regions, the pattern sizes of the microwave transmission lines in those regions must be narrowed to achieve proper impedance matching. Consequently, the transmission losses of the lines are increased.

SUMMARY OF THE INVENTION

It is a primary object of the present invention to provide an improved microwave monolithic integrated circuit which is highly efficient and reliable, having excellent heat radiation characteristics and low transmission losses in the microwave operation band.

A further object of the present invention is to provide such an improved microwave monolithic integrated circuit in which the patterning of the passive regions may be easily achieved.

Other objects and advantages of the invention will be apparent from the following detailed description.

In accordance with the present invention, there is provided a a microwave monolithic integrated circuit comprising a semiconductor or semiinsulator substrate having upper and lower opposed surfaces. At least one active region and at least one passive region are produced on the upper surface of the substrate. A heat sink is plated on the lower surface of the semiconductor substrate. Prior to applying the plated heat sink, the substrate lower surface is altered to render the substrate thickness beneath the active region smaller than the substrate thickness beneath at least one passive region, thereby disposing the heat sink near the active region to improve the heat dissipation.

DESCRIPTION OF THE PREFERRED EMBODIMENTS

While the invention will be described in connection with certain preferred embodiments, it will be understood that it is not intended to limit the invention to these particular embodiments. On the contrary, it is intended to cover all alternatives, modifications, and equivalents included within the spirit and scope of the invention as defined by the appended claims.

Figure 3:
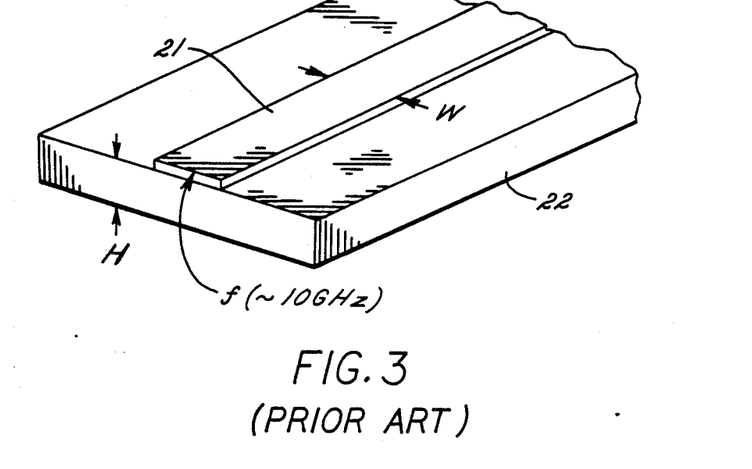
FIG. 3 is a perspective view of a prior art microwave transmission line of general construction.

Typically, each of the passive regions of a MMIC is associated with a microwave transmission line having a predetermined pattern size (i.e., width) and a desired characteristic impedance. As is well known in the art, there is a predetermined relationship between the pattern size of a microwave transmission line, the characteristic impedance thereof, and the thickness of the substrate beneath the transmission line. Specifically, when a microwave transmission line 21 has a predetermined width W and the substrate material 22 beneath the microwave transmission line 21 has a thickness H (see FIG. 3), the characteristic impedance $Z_0$ of the microwave transmission line is defined by the following formulae:

$$Z_0 = \frac{60}{\sqrt{\epsilon_{rE}}} \ln(8H/W + 0.25W/H), \text{ if } W/H < 1$$

$$= \frac{120\pi}{\sqrt{\epsilon_{rE}}} [W/H + 1.393 + 0.667 \ln(W/H + 1.444)]^{-1}, \text{ if } W/H \geq 1$$

wherein the entire transmission line device has a dielectric constant $\epsilon_{rE}$ defined by $$\epsilon_{rE} = \frac{\epsilon_r + 1}{2} + \frac{\epsilon_r - 1}{2} F(W/H)$$

in which $\epsilon_r$ is the dielectric constant of the substrate material 22 and the function F(W/H) is defined by $$F(W/H) = (1 + 12H/W)^{-\frac{1}{2}} + 0.04 (1 - W/H)^2, \text{ if } W/H < 1$$
$$= (1 + 12H/W)^{-\frac{1}{2}}, \text{ if } W/H \geq 1.$$

Figure 4:
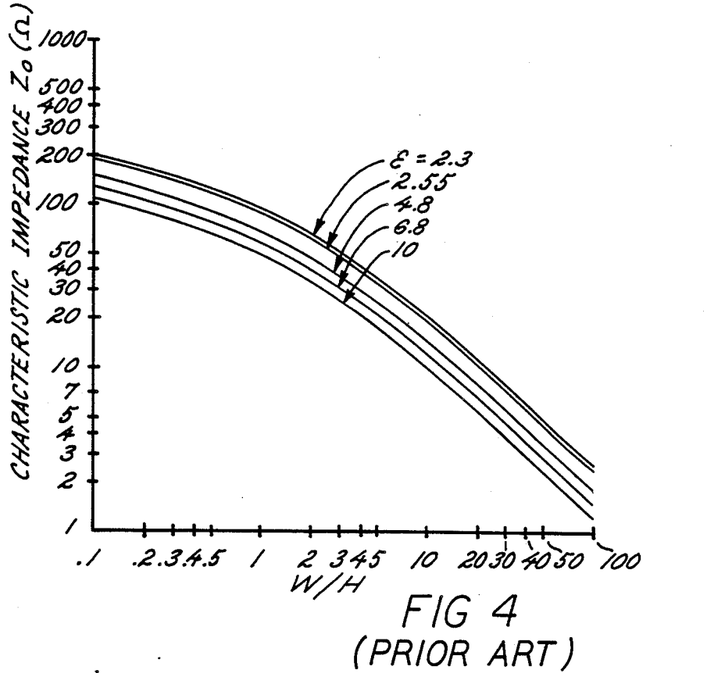
FIG. 4 is a graph showing the relationship between the W/H quotient and the characteristic impedance $Z_0$ of the prior art microwave transmission line of FIG. 3.
Figure 5A:
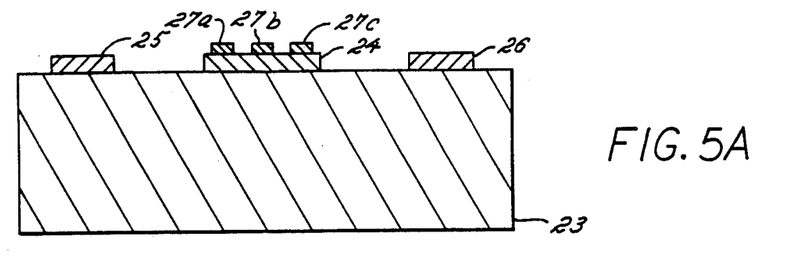
FIGS. 5A to 5D illustrate in cross section a process for producing electrical interconnections between the passive and active regions of a MMIC.
Figure 5B:
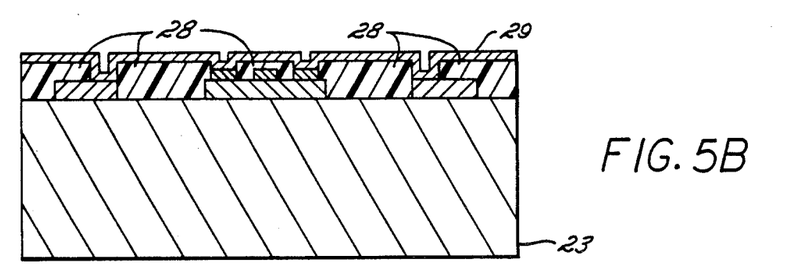
Figure 5C:
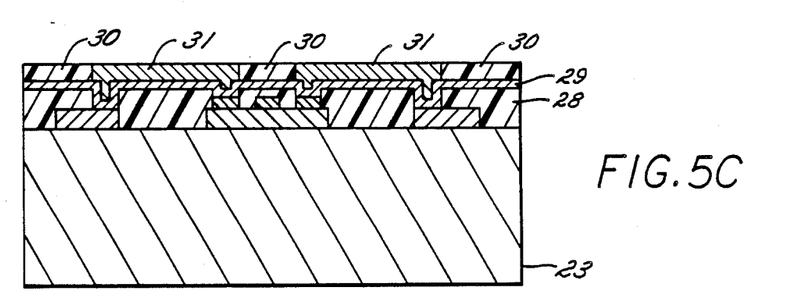
Figure 5D:
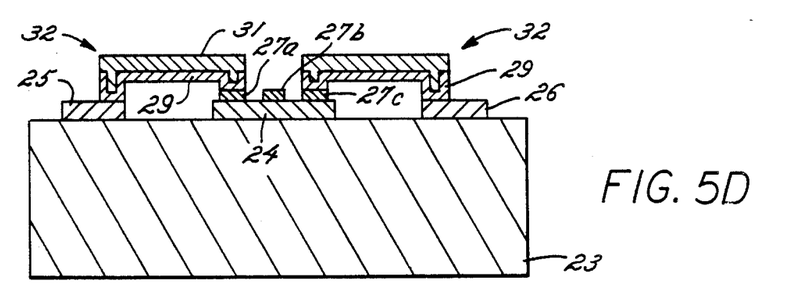

FIG. 4 shows the relationship between the W/H quotient and the characteristic impedance $Z_0$ of the microwave transmission line at different dielectric constant $\epsilon_r$ values for the underlying substrate material. Thus, it may be seen that the characteristic impedance $Z_0$ decreases as the W/H quotient increases (i.e., as the width of the transmission line increases or the thickness of the underlying substrate material decreases). Accordingly, if it is desired to maintain the characteristic impedance $Z_0$ of a transmission line at a constant value as the thickness H of the substrate underlying the line is decreased, the width W of the line must also be decreased. In other words, in producing microwave transmission lines associated with the passive regions of a MMIC, it must be kept in mind that the thinner the substrate is beneath the passive sections, the smaller the transmission line pattern size must be to keep the characteristic impedance constant. Decreasing the pattern size makes it harder to produce and increases the transmission losses of the line at microwave frequencies, thus deteriorating the overall characteristics of the MMIC.

Referring to FIGS. 5A to 5D, there is shown a method of interconnecting the active region of a MMIC with its passive regions. A MMIC generally comprises (FIG. 5A) a semiconductor or semiinsulator substrate 23 having an active region 24 (which may include at least one MESFET) and first and second passive regions 25, 26. The active region 24 has three electrodes: a drain 27a, a gate 27b, and a source 27c. A resist 28 is selectively placed on the top surface of the MMIC (see FIG. 5B), covering all but the drain 27a, the source 27c, and portions of the two passive regions 25, 26. The entire surface of the resist 28 is then coated with a metal film 29 so that the active and passive regions of the MMIC are electrically interconnected. Another resist 30 is then selectively placed above portions of the active and passive regions of the MMIC (FIG. 5C) and, thereafter, a metallized layer 31 is electrolytically produced using the metal film 29 as the electrode. Finally, the two resists 28, 30 are removed, producing two metallized bridges 32 (each comprising portions of the metal film 29 and the electrolytic metallized layer 31) which electrically connect the drain 27a to a first passive region 25 and the source 27c to a second passive region 26, respectively. As so configured (FIG. 5D), the MMIC may be used as an amplifier, but, as discussed above, would have inadequate heat radiating characteristics.

In accordance with a first embodiment of the present invention, portions of the substrate 23 of a MMIC are selectively decreased in thickness using well-known grinding and etching techniques and a heat sink is plated on the newly-configured lower surface of the substrate. This process is described in greater detail below with reference to FIGS. 6A to 6G.

Figure 6A:
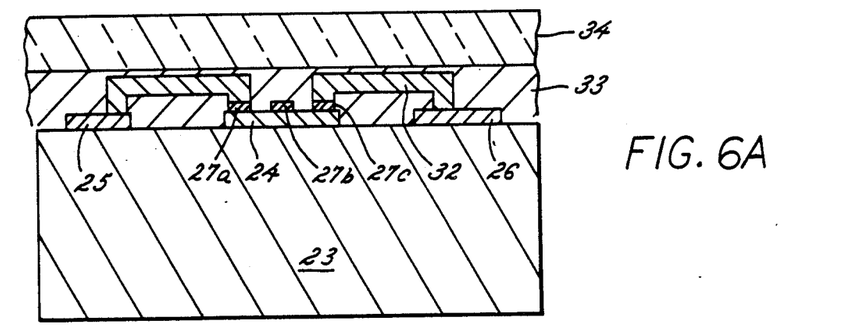
FIGS. 6A to 6G illustrate in cross section a process for producing a MMIC according to a first embodiment of the present invention.

First, as shown in FIG. 6A, a coating of wax 33 is provided which completely covers the top surface of the MMIC, including the active region 24, the passive regions 25, 26 and the metallized bridges 32 therebetween. A glass plate 34 is then placed over the layer of wax 33, and together these elements serve to protect the active and passive regions, and their interconnections, while the bottom surface of the substrate 23 is being worked.

Figure 6B:
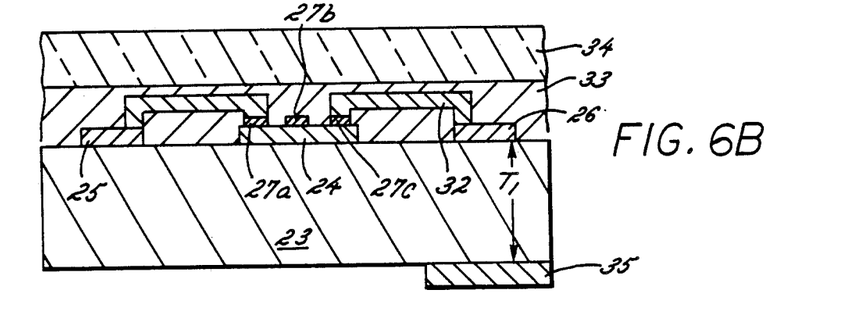
Figure 6C:
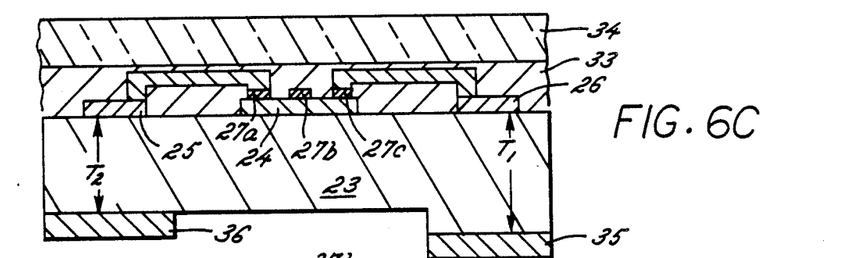
Figure 6D:
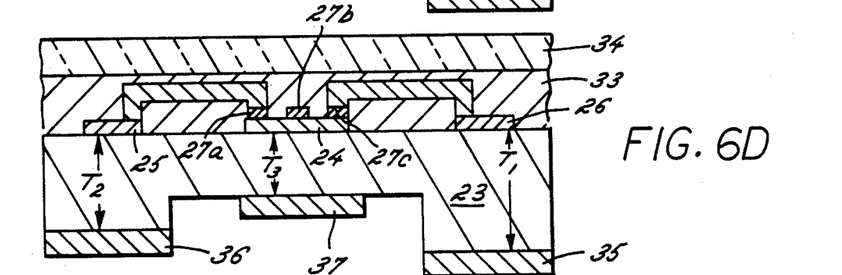
Figure 6E:
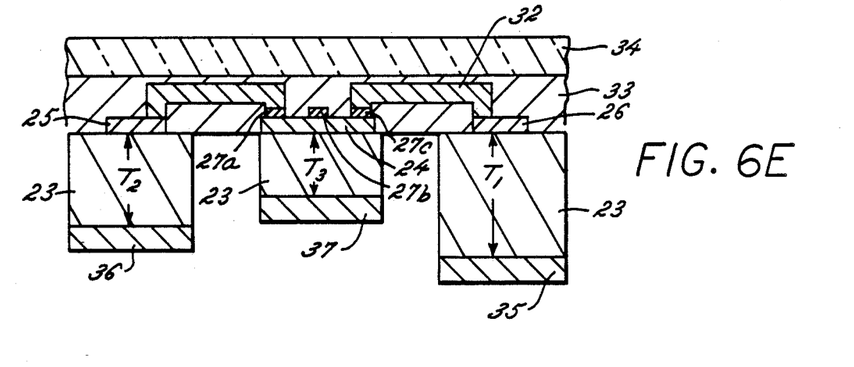

After the wax coating 33 and the glass plate 34 are in place, the bottom surface of the substrate 23 is ground away so that the entire substrate has a uniform predetermined thickness. For example, as shown in FIG. 6B, the bottom surface of the substrate 23 is ground until the thickness of the substrate is equal to a thickness $T_1$ which is desired under the passive region 26 for output impedance matching purposes. Thereafter, the portion of the bottom surface of the substrate 23 underlying the passive region 26 is coated with a resist mask 35, and the uncoated portion is etched using a conventional technique, such as reactive ion etching. Thus, the thickness of the substrate 23 beneath the passive region 26 is maintained at the desired dimension $T_1$, while the remainder of the substrate is further decreased in thickness (FIG. 6C) until it equals a thickness $T_2$ which is desired beneath the other passive region 25 for input impedance matching purposes. A second resist 36 is placed on the portion of the lower surface of the substrate 23 underlying the passive region 25, and the remaining uncoated portion is further etched. Once the thickness of the substrate underlying the active region 24 is decreased to its desired dimension $T_3$ (FIG. 6D), the etching again ceases and a third resist 37 is placed on the portion of the lower surface of the substrate underlying the active region 24. Etching is then resumed until substantially all of the substrate 23 underlying the regions intermediate to the active region 24 and the passive regions 25, 26 is removed (FIG. 6E).

Figure 6F:
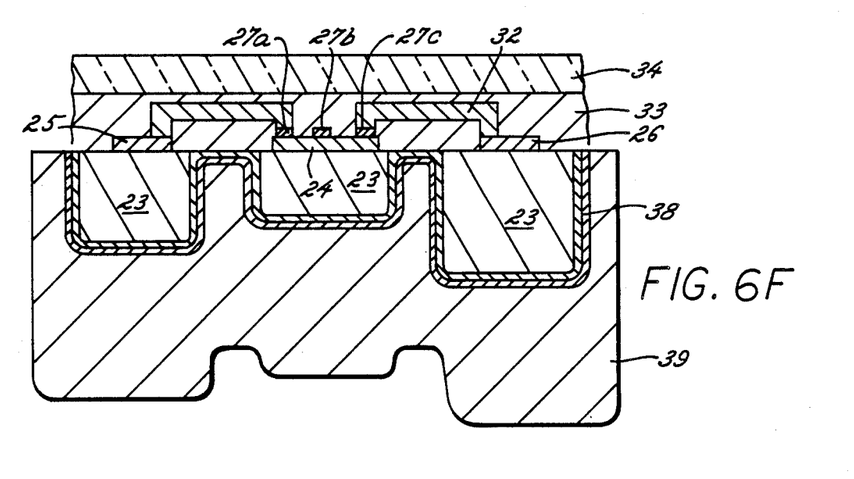
Figure 6G:
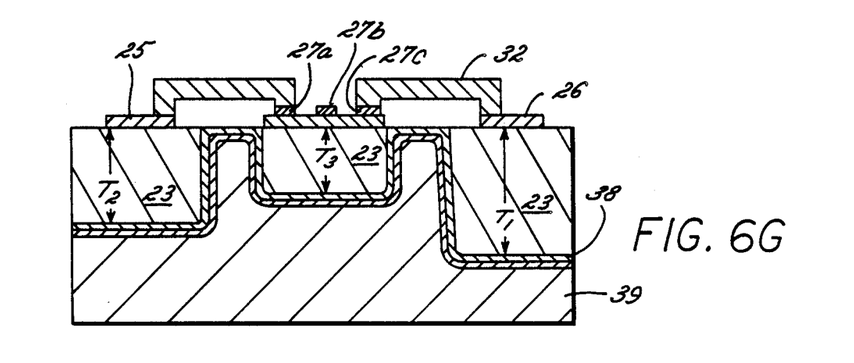

Next, the three resist masks (35, 36 and 37) are removed and a non-electrolytic metallized cladding layer 38 (having a thickness of approximately 0.5 microns and comprising nickel and gold, for example) is deposited on the entire lower surface of the etched substrate 23 (FIG. 6F). Using this cladding layer 38 as an electrode, a layer of gold (or other metallized material having a high thermal conductivity) is then electrolytically plated on the entire underside of the MMIC to form a heat sink 39. This heat sink underlies the active and passive regions of the MMIC and fills the intermediate regions so as to at least partially surround the portion of substrate beneath the active region. Finally, as shown in FIG. 6G, the bottom surface of the heat sink layer 39 is ground flat, and the glass plate 34 and the wax 33 are removed from the top surface of the MMIC.

Figure 7:
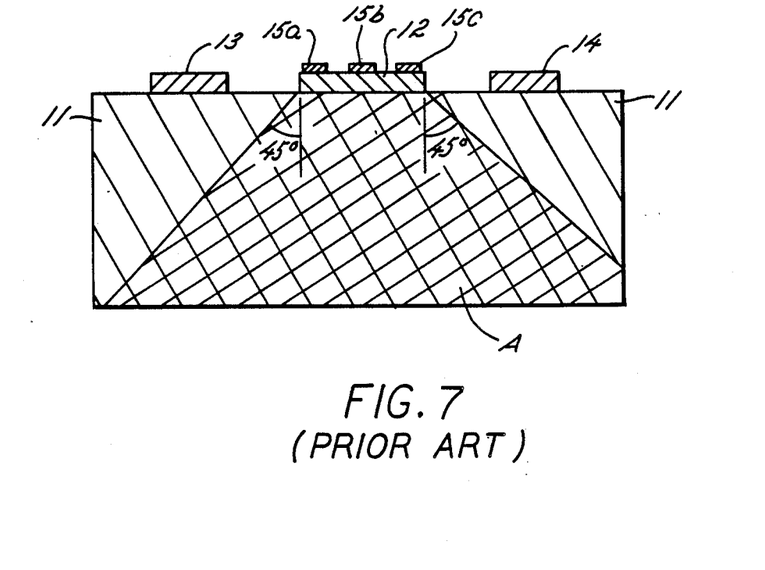
FIG. 7 is a cross-sectional view showing the path through which heat is radiated from the active region of a prior art MMIC.

With this configuration, the active region of a MMIC has substantially improved heat radiating characteristics. A large part of the heat generated by the active region is irradiated downwardly by diffusion through the underlying substrate. This characteristic is shown in FIG. 7 for a prior art MMIC, wherein approximately eighty percent of the generated heat is diffused through a conical section A of the substrate 11 underlying the active region 12. It is therefore understandable that such prior art MMICs have poor heat radiating characteristics, since the thick substrate has a low thermal conductivity (e.g., GaAs has a thermal conductivity of 0.8 W/cm·deg) and, thus, prevents efficient heat radiation.

In contrast, a MMIC configured in accordance with the above-described embodiment of the present invention (FIG. 6G) has only a relatively thin substrate of semiconductor or semiinsulator material underlying the active region 24, and has a heat sink 39 having a relatively high thermal conductivity (e.g., the thermal conductivity of gold is approximately 3.1 W/cm·deg) provided to surround that portion of the substrate. Heat generated in the active region 12 quickly escapes through both the bottom and side surfaces of the underlying thin substrate into the highly conductive heat sink 39, thereby transversely expanding the heat radiation zone of the MMIC substantially beyond the conical section A shown in FIG. 7 for the prior art configuration. Accordingly, heat is diffused more rapidly, suppressing the operating temperature of the MMIC and enhancing its reliability.

It should be noted that in practicing this invention it is possible to reduce the substrate underlying the active region to a thickness $T_3$ as small as 0.5 microns. However, in order to maximize the performance characteristics of the active region (which may comprise at least one MESFET), it is best that the substrate beneath that region have a thickness $T_3$ in the range of 30-100 microns, with 30, 50 and 100 microns being preferred values in that range. With regard to the substrate portions intermediate to the active and passive regions, it is preferable to reduce those portions to a thickness of approximately 0.5 microns in order to maximize the transverse diffusion of heat.

As discussed above, a further benefit of this invention is that it provides for relatively simple establishment of desired characteristic impedances ($Z_0$) for the respective microwave transmission lines associated with the passive regions. Thus, in accordance with the previously discussed formulae relating to $Z_0$, it is possible to set the characteristic impedance of a microwave transmission line having a preset width W to a desired value by decreasing the thickness ($T_1$, $T_2$) of the semiconductor substrate underlying the respective passive region. Typically, the substrates underlying the passive regions of the MMIC should have thicknesses in the range of 100-200 microns, with 100, 150 and 200 micron thicknesses being preferred to establish typical input and output impedances for transmission lines having standard pattern sizes (i.e., widths).

It will be noted, therefore, that the present invention provides improved heat radiating characteristics for the active region of the MMIC, while, at the same time, providing for impedance matching without adjusting the pattern sizes of the respective transmission lines associated with the passive regions. Thus, large standard pattern sizes may be used, making production of the MMIC easy and reducing transmission losses in the microwave operating band.

Figure 8:
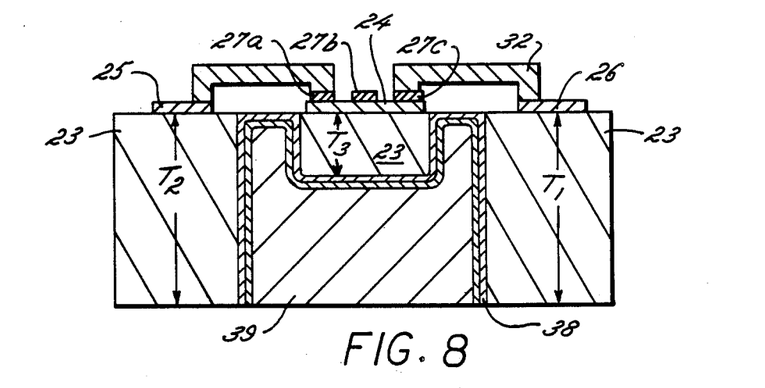
FIG. 8 is a cross-sectional view of a second embodiment of the present invention.

A second embodiment of a MMIC according to the present invention is shown in FIG. 8. This embodiment is substantially the same as the embodiment of FIG. 6G, except that the portions of the substrate 23 beneath the two passive regions 25, 26 have equal respective thicknesses $T_1$, $T_2$ and have no underlying plated heat sink. This is accomplished by applying a resist mask (such as mask 35 in FIG. 6B) which covers both portions of the bottom surface of the substrate underlying the two passive regions and, thereafter, etching the substrate beneath only the active and intermediate regions. Accordingly, a heat sink 39 is provided only under the active and intermediate regions so as to at least partially surround the substrate portion beneath the active region. Nevertheless, due to the decreased thickness $T_3$ of the substrate 23 beneath the active region and the close proximity of the heat sink 39 to the active region, this embodiment of the present invention also exhibits excellent heat radiating characteristics.

As can be seen from the foregoing detailed description, this invention provides an improved microwave monolithic integrated circuit which has excellent heat radiating characteristics and low microwave operation transmission losses and is, therefore, highly efficient and reliable. Moreover, this invention provides for impedance matching of the input and output of the MMIC while utilizing standard, easily-produced, pattern sizes for the transmission lines associated with the passive regions.

What is claimed is:

1. A microwave monolithic integrated circuit comprising:
    a substrate having upper and lower opposed surfaces;
    at least one active region and at least one passive region produced on the upper surface of the substrate, said regions being electronically coupled to one another; and
    a heat sink produced on the lower surface of the substrate;
    wherein the substrate thickness beneath the active region is smaller than the substrate thickness beneath at least one passive region, thereby disposing the heat sink near the active region to improve heat dissipation therefrom, the substrate thickness beneath the at least one passive region being adapted to provide the passive region with a terminating impedance of a predetermined magnitude.

2. The microwave monolithic integrated circuit of claim 1 further comprising at least one MESFET active region and input and output passive regions, wherein the substrate is a gallium arsenide crystal having limited heat transfer characteristics and the heat sink comprises a metallized material placed on the lower surface of the crystal.

3. The microwave monolithic integrated circuit of claim 1, wherein said active region and said passive regions are separated by intermediate areas and the substrate thickness beneath the intermediate areas is smaller than the substrate thickness beneath the active region such that the heat sink at least partially surrounds the substrate beneath the active region.

4. The microwave monolithic integrated circuit of claim 1, wherein each passive region is associated with a respective microwave transmission line having a predetermined width and a desired characteristic impedance and the thickness of the substrate beneath each of said passive regions is established individually based on the width and the desired characteristic impedance of each respective microwave transmission line.

5. The microwave monolithic integrated circuit of claim 1, wherein each passive region is associated with a respective microwave transmission line having a predetermined width and a desired characteristic impedance and the substrate beneath each of said passive regions has the same thickness.

6. The microwave monolithic integrated circuit of claim 5, wherein the respective transmission lines of the plurality of passive regions all have substantially the same width so that each transmission line has substantially the same desired characteristic impedance.

7. The microwave monolithic integrated circuit of claim 5, wherein the respective transmission lines of the plurality of passive regions have different widths so that each transmission line has a different desired characteristic impedance.

8. The microwave monolithic integrated circuit of claim 1, wherein two passive regions are associated with the active region to establish desired input and output characteristic impedances for the circuit.

9. The microwave monolithic integrated circuit of claim 8, wherein the substrate beneath each of the passive regions has substantially the same thickness so that the input characteristic impedance is substantially equal to the output characteristic impedance.

10. The microwave monolithic integrated circuit of claim 8, wherein the substrate has a different thickness beneath the two passive regions, thereby separately setting different values for the input and output characteristic impedances.

* * * * *